United States Patent [19]
Lee

[11] Patent Number: 5,563,097
[45] Date of Patent: Oct. 8, 1996

[54] METHOD FOR FABRICATING SEMICONDUCTOR DEVICE

[76] Inventor: Young J. Lee, Samsung Apt. 2-903, Oryu-dong, Jung-ku, Daejeon-si, Rep. of Korea

[21] Appl. No.: 422,973

[22] Filed: Apr. 17, 1995

[51] Int. Cl.⁶ .................................................. H01L 21/44
[52] U.S. Cl. ........................ 437/187; 437/192; 437/195; 437/245; 437/246
[58] Field of Search .................................. 437/187, 192, 437/195, 245, 246; 257/758, 760

[56] References Cited

U.S. PATENT DOCUMENTS

| | | | |
|---|---|---|---|
| 4,924,295 | 5/1990 | Kuecher | 257/751 |
| 5,006,484 | 4/1991 | Harada | 437/192 |
| 5,187,120 | 2/1993 | Wang | 437/192 |
| 5,342,652 | 8/1994 | Foster et al. | 427/253 |
| 5,407,698 | 4/1995 | Emesh | 427/99 |

FOREIGN PATENT DOCUMENTS

| | | |
|---|---|---|
| 2-143445 | 6/1990 | Japan . |
| 5-152449 | 6/1993 | Japan . |

*Primary Examiner*—George Fourson
*Assistant Examiner*—C. Everhart
*Attorney, Agent, or Firm*—Alan R. Loudermilk

[57] ABSTRACT

A method for burying contact holes having different depths at the same time using selective tungsten deposition at the time of fabricating a semiconductor device. The method for fabricating a semiconductor device may include the steps of: forming a first insulation layer on a semiconductor substrate having first conduction lines formed thereon; forming a first contact hole by carrying out a selective etching of a designated part of the first insulation layer; forming a conduction layer over the first insulation layer including the first contact hole for forming a second conduction line; forming a TiN layer on the conduction layer; patterning the TiN layer and the conduction layer with a second conduction line pattern; planarizing the surface of the substrate by forming a second insulation layer on the second conduction line and the first insulation layer; forming second contact holes exposing each of the surfaces of the first conduction line and the second conduction line by carrying out a selective etching of designated parts of the second insulation layer and the first insulation layer; and fully and simultaneously burying each of the second contact holes by carrying out a selective deposition of tungsten exhibiting a time delay on the TiN layer, thereby facilitating simultaneous and easy burial of contact holes having different depths.

18 Claims, 3 Drawing Sheets

METHOD FOR FABRICATING SEMICONDUCTOR DEVICE

FIELD OF THE INVENTION

The present invention relates to methods for fabricating semiconductor devices, more particularly to a method for burying contact holes having different depths at the same time using selective tungsten deposition during fabrication of a semiconductor device.

BACKGROUND OF THE INVENTION

As the integration of semiconductor devices advances, three dimensional construction of individual elements to be formed in an active area has become necessary, and, due to this, as the height of elements from the surface of a substrate increase and differences between the heights of elements become more and more severe, planarization of elements using an insulation layer becomes essential for interconnection between the elements.

The planarization, however, causes differences of depths between the contact holes provided for wiring individual elements having different heights from the surface of the substrate. For example, there are differences of depths, such as between a gate strapping contact of a transistor and a contact of a source or drain region, or between a buried bit line contact and a contact of a source or drain region.

Such a difference of depths between contact holes may cause non-uniform contact filling with a selective chemical deposition of metallic material.

That is, as illustrated in FIG. 1, when contact holes are formed for exposing surfaces of designated conduction lines, such as, gate 2 and impurity diffusion region 3 of a transistor formed on substrate 1, a difference of depths of contact holes formed in layer 4 is caused by the difference of heights of gate 2 and impurity diffusion region 3 from the surface of substrate 1. In case such contact holes having different heights are buried with metallic material 5, such as tungsten, the burying may not be complete in the deeper contact hole, while the burying in the lower contact hole may be excessive.

In case of burying a metal into contact holes having various contact depths with a selective deposition of metal, the maximum depositable thickness of the metal is restricted by the depth of the contact hole having the lowest depth. Reference is made to R. J. Saia, et al., Tungsten and Other Refractory Metals for VLSI Application III. edited by V. L. Wells (MRS, Pittsburgh, Pa.) pp. 349, 1987. Therefore, even though the lowest contact hole may be buried fully, the deepest hole may not be buried fully, which makes the metal wiring process difficult.

Due to this, a method that uses a chemical deposition of polycrystal silicon has been suggested as a method for fully burying contact holes having different depths existing in one element at the same time. Reference is made to K. K. Choi, et al., Proc. VLSI Multilevel Interconnection Conf., pp. 286, 1992.

The method for fully burying contact holes of different depths using chemical deposition of polycrystal silicon is illustrated in FIG. 2A. After forming contact holes exposing designated conduction lines, for example, bit line 6 and impurity diffusion region 3 formed on substrate 1 through planarized insulation layer 4 (in this example, the difference of depths of the contact holes is caused by the difference of heights of bit line 6 and impurity diffusion region 3 from the surface of substrate 1), polycrystal silicon 7a is deposited over the insulation layer including the contact holes.

As illustrated in FIG. 2B, after carrying out an anisotropic dry etching of deposited polycrystal silicon 7a, polycrystal silicon layers 7b remain only on the side walls of the contact holes. By carrying out a selective deposition of tungsten 5 thereon, tungsten is grown at the bottoms and sides of the contact holes, and the contact holes can be buried irrespective of the depths of the contact holes.

Since deposition of polycrystal silicon and anisotropic etching of the deposited polycrystal silicon must be carried out, however, the method has problems, such as requiring complicated processes and damaging the conduction layers under the bottoms of the contact holes as a consequence of the etching.

SUMMARY OF THE INVENTION

An object of the present invention is to solve the foregoing problems, and to provide a method which can fully and simultaneously bury contact holes having different depths existing on a semiconductor device.

These and other objects and features of this invention can be achieved by providing a method for fabricating a semiconductor device, including steps of: forming a first insulation layer on a semiconductor substrate having first conduction lines formed thereon; forming a first contact hole by carrying out a selective etching of a designated part of the first insulation layer; forming a conduction layer over the first insulation layer including the first contact hole for forming a second conduction line; forming a TiN layer on the conduction layer; patterning the TiN layer and the conduction layer with a second conduction line pattern; planarizing surface of the substrate by forming a second insulation layer on the second conduction line and the first insulation layer; forming second contact holes exposing each of the surfaces of the first conduction line and the second conduction line by carrying out a selective etching of designated parts of the second insulation layer; and fully and simultaneously burying each of the second contact holes by carrying out a selective deposition of tungsten.

The tungsten is selectively deposited utilizing a $WF_e$ chemistry that may include an $H_2$ reduction and an $SiH_4$ reduction.

The second conduction line can be a gate or a buried bit line of a transistor, and the first conduction line can be either a source or drain region or a wiring strapping part. The source and the drain regions can be formed of impurity doped regions of single crystal silicon or regions formed of metal self-aligned silicide serving as barriers.

DETAILED DESCRIPTION OF THE INVENTION

This invention is to be explained in detail, referring to the attached drawings.

It is reported that, in general, tungsten deposition on a TiN layer has a time delay of 7 to 10 minutes for deposition under a chemistry of $WF_6$—$H_2$. Reference is made to V. V. Rana, et al., Workshop on Tungsten and Other Refractory Metals for VLSI Appl. II, pp. 187, 1987, and E. K. Broadbent, J. Vac. Sci. Technol., B5(6), pp. 1661, 1987. Such an initial deposition delay, having not been observed in silicon or other metals and metal silicides, is believed to arise due to a very low rate of reaction of TiN with $WF_6$ gas. This invention relates to a discovery for burying at least two kinds of contact holes having different depths at the same time utilizing such a characteristic of tungsten.

This invention performs simultaneous burying of contact holes of different depths based on the initial deposition delay characteristic of tungsten on a TiN layer through deposition of tungsten into contact holes having different depths after forming the TiN layer in advance on a surface of a conduction layer whereon a contact hole of relatively low depth will be formed.

Particularly, a complete and simultaneous burial of contact holes of different depths can be performed by taking the difference of contact hole depths into account and combining a deposition delay period of time and a deposition rate of tungsten on the TiN layer based on the chosen tungsten deposition method because the depth of contact holes can be varied depending on the kinds and class of elements intended to be fabricated.

The method for burying contact holes based on selective deposition of tungsten in accordance with one embodiment of this invention is to be explained hereinafter, referring to FIGS. 3A–3D.

Figure 1:
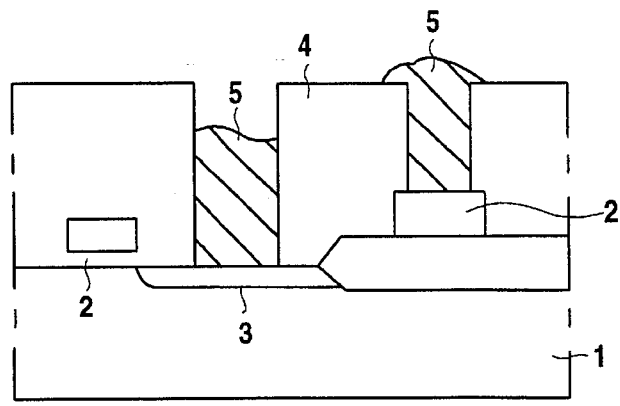
FIG. 1 illustrates a conventional method for burying contact holes of a semiconductor device having different depths.
Figure 2A:
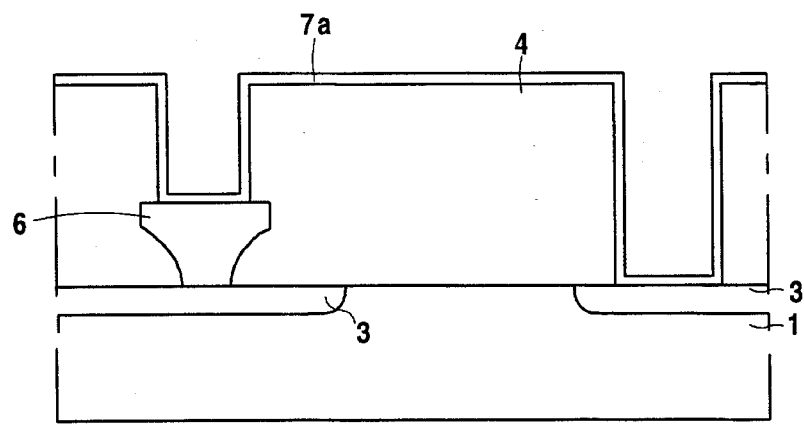
FIGS. 2A and 2B illustrate a conventional method for burying contact holes of a semiconductor device having different depths utilizing polycrystal silicon side walls.
Figure 2B:
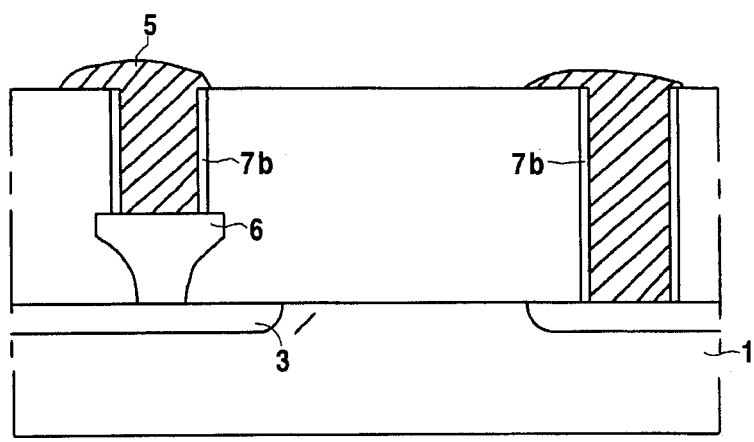
Figure 3A:
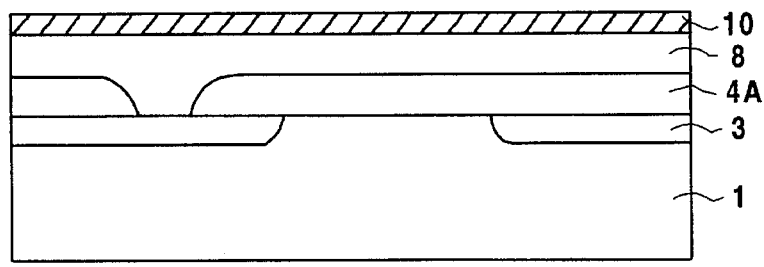
FIGS. 3A–3D illustrate a method for burying contact holes of a semiconductor device having different depths in accordance with this invention.

First, as illustrated in FIG. 3A, after forming first insulation layer 4A on semiconductor substrate 1 having, for example, source and drain regions of a transistor formed of impurity diffusion regions 3 in designated areas thereof as lower conduction lines, a first contact hole exposing impurity diffusion region 3 is formed by carrying out a selective etching of first insulation layer 4A. After depositing, for example, any one of doped polycrystal silicon, metal silicide, or polycide as a conduction layer over the surface of the substrate for forming a conduction line, which may be, for example, bit line (or a transistor gate) 8 connected to impurity diffusion region 3 through the first contact hole, TiN layer 10 is deposited to a thickness in the range of about 30 to 300 µm with a chemical vapor deposition (CVD) method, such as reactive sputtering, PVD, LPCVD, or MOCVD.

Figure 3B:
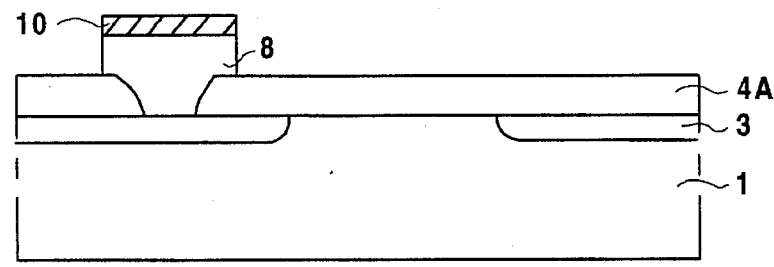

As illustrated in FIG. 3B, TiN layer 10 and bit line 8 are subjected to a patterning with a desired bit line pattern through a photoetching process.

Figure 3C:
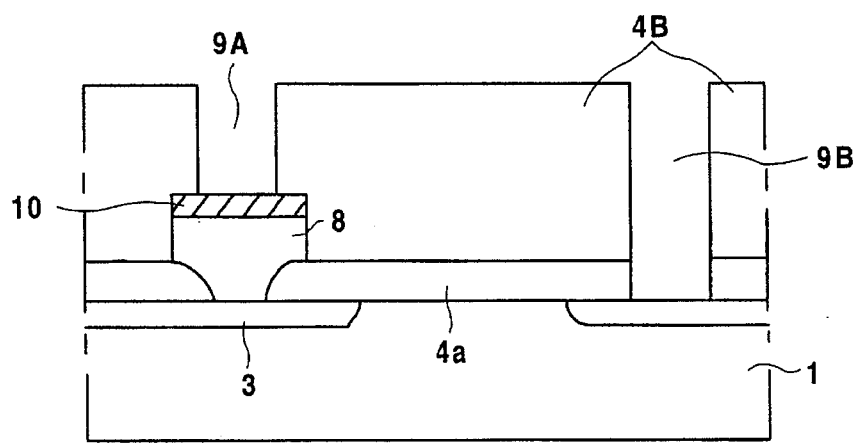

As illustrated in FIG. 3C, after planarizing the substrate with second insulation layer 4B formed over substrate 1, second contact holes exposing TiN layer 10 on bit line 8 and impurity diffusion region 3 are formed by carrying out a selective etching of second insulation layer 4B and first insulation layer 4A. In this instant, as illustrated, the depth of the contact hole over TiN layer 10 on bit line 8 is lower (shallower) than the contact hole over impurity diffusion region 3.

Figure 3D:
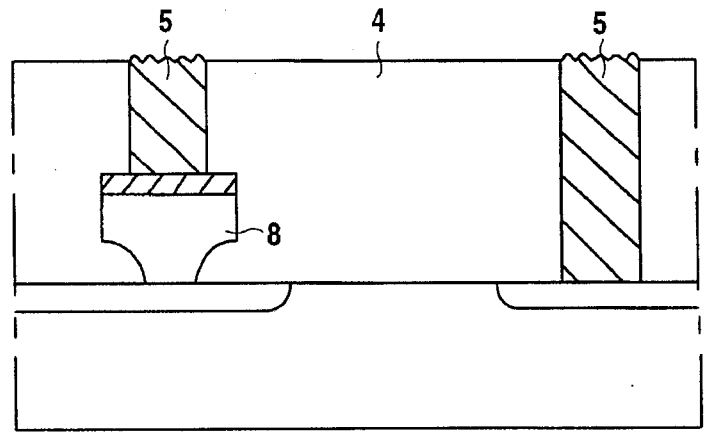

As illustrated in FIG. 3D, by depositing tungsten 5 on the surfaces of the conduction lines, i.e., on the surfaces of TiN layer 10 and impurity diffusion region 3 exposed by the contact holes using, for example, a $WF_6$ chemistry, contact holes of different depths can be buried at the same time. The contact holes also can be buried with various metallic materials, such as aluminum or copper instead of tungsten.

In general, the tungsten selective deposition at a silicon contact like impurity diffusion region 3 is carried out at a deposition temperature of about 300° C. to maintain selectivity between an insulation layer and conduction lines, and in order to minimize encroachment in deposition of tungsten at the silicon contact, $WF_6$—$SiH_4$ chemistry is used, rather than $WF_6$—$H_2$ chemistry.

Figure 4A:
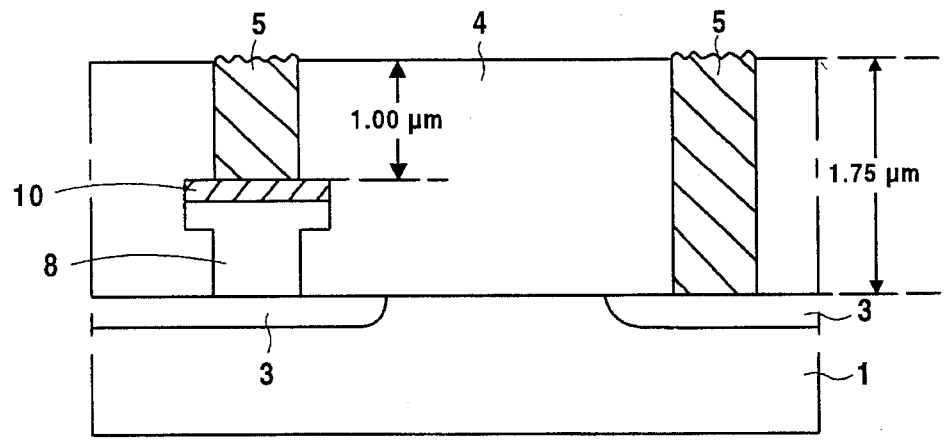
FIGS. 4A and 4B illustrate one embodiment of a method for burying contact holes of a semiconductor device having different depths in accordance with this invention.

In case a $WF_6$—$SiH_4$ chemistry is used, the tungsten deposition delay period of time on the TiN layer is exhibited for about 1 to 3.5 minutes. The delay depends on the deposition temperature, the ratio of $SiH_4$ to $WF_6$, and the surface condition of the TiN. For example, as illustrated in FIG. 4A, if it is assumed that the difference of the depths of the two contact holes is 0.75 µm, the depth of the contact hole over impurity diffusion region 3 (which may be n+) is 1.75 µm, the deposition delay period of time is 3 minutes, and the rate of deposition of tungsten is 0.25 µm per minute, the two contact holes having different depths can be fully buried at the same time after tungsten deposition for about 7 minutes.

Figure 4B:
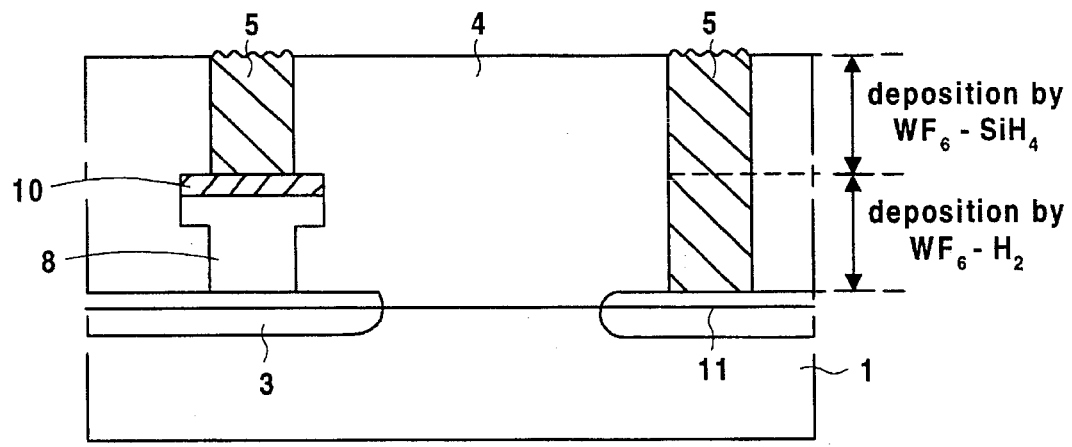

As another example, as illustrated in FIG. 4B, in case self-aligned silicide has been formed in the silicon contact in advance, after initially burying the deeper contact hole up to the same height with the lower contact hole using $WF_6$—$H_2$, the two contact holes that had different depths can be buried fully by depositing tungsten into the two contact holes at the same rate and at the same time using $WF_6$—$SiH_4$. This embodiment utilizes the characteristic that the tungsten deposition hardly occurs on a TiN layer within a deposition temperature range of tungsten for the selective deposition. In case tungsten is deposited using $WF_6$—$H_2$, since the tungsten deposition does not occur on the TiN layer, but only on self-aligned silicide layer 11, after the deeper contact hole over self-aligned silicide layer 11 is buried initially until the depth of the deeper contact hole becomes about the same as the depth of the contact hole over TiN layer 10, the two contact holes are buried at the same time using $WF_6$—$SiH_4$.

In this case, as the surface of the TiN has been activated sufficiently while it is exposed to $WF_6$—$H_2$, the tungsten deposition thereafter using $WF_6$—$SiH_4$ can be done immediately without any time delay.

As has been explained, this invention facilitates easy burial of contact holes since the tungsten deposition can be done under a condition that an aspect ratio of the contact holes to the design can be maintained because forming of side walls like the foregoing conventional method for burying contact holes using polycrystal silicon side walls is not required, as well as prevention of degradation of element characteristics since there will not be any damage to the surface of the lower layer at the bottom of the contact hole because an etching process for forming side walls is not required, and prevention of reduction of selectivity at the tungsten selective deposition since damage of the insulation layer also can be prevented.

Since contact holes with different depths simply can be buried at the same time without any other additional process steps, except a process for forming a TiN layer in advance on conduction lines and contact holes to be formed thereon, it is advantageous in light of production cost.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for fabricating a semiconductor device comprising the steps of:

forming a first insulation layer on a semiconductor substrate having a first conduction line formed thereon;

forming a first contact hole to the substrate by selectively etching a portion of the first insulation layer;

forming a conduction layer on the first insulation layer and in the first contact hole;

forming a TiN layer on the conduction layer;

patterning the TiN layer and the conduction layer to form a second conduction line;

forming a planarizing second insulation layer on the second conduction line and the first insulation layer;

forming second contact holes to the first conduction line and the second conduction line by selectively etching portions of the second insulation layer and a portion of the first insulation layer, wherein the second contact hole to the first conduction line has a depth deeper than the second contact hole to the second conduction line; and simultaneously burying each of the second contact holes by selective deposition of tungsten, wherein the selective deposition of the tungsten on the TiN layer of the second conduction line exhibits a time delay.

2. The method of claim 1, wherein the tungsten is selectively deposited utilizing a $WF_6$ chemistry.

3. The method of claim 2, wherein the $WF_6$ chemistry includes an $H_2$ reduction and an $SiH_4$ reduction.

4. The method of claim 1, wherein the TiN layer is formed by depositing TiN to a thickness in a range of about 30 to 300 μm with a reactive sputtering or a CVD method.

5. The method of claim 1, wherein the second conduction line comprises a gate or a buried bit line of a transistor.

6. The method of claim 1, wherein the first conduction line comprises a source or drain region or a wiring strapping element.

7. The method of claim 6, wherein the source or drain region comprises an impurity doped region of single crystal silicon or a region formed of metal self-aligned silicide serving as a barrier.

8. The method of claim 1, wherein at the time of tungsten deposition, a barrier metal has been formed on the surface of the first conduction line, wherein the second contact hole over the first conduction line is buried up to about the height of the second conduction line with a $WF_6$ chemistry that utilizes $H_2$ reduction, wherein the second contact hole over the first conduction line and the second contact hole over the second conduction line are simultaneously buried with a $WF_6$ chemistry that utilizes $SiH_4$ reduction.

9. The method of claim 1, wherein the first conduction line comprises silicon, wherein the second contact hole over the first conduction line is deeper than the second contact hole over the second conduction line, wherein the second contact holes are simultaneously buried with a $WF_6$ chemistry that utilizes $SiH_4$ reduction.

10. A method of fabricating a semiconductor device, comprising the steps of:

forming first and second conduction lines of the semiconductor device on a semiconductor substrate:

selectively forming TiN on the first conduction line;

forming an insulation layer on the substrate including over the first and second conduction lines;

forming contact holes through the insulation layer to the first and second conduction lines, wherein the contact hole to the second conduction line has a depth deeper than the contact hole to the first conduction line; and filling the contact holes with metal by selectively depositing tungsten, wherein the selective deposition of the tungsten on the TiN layer of the second conduction line exhibits a time delay.

11. The method of claim 10, wherein the tungsten is selectively deposited utilizing a $WF_6$ chemistry.

12. The method of claim 11, wherein the $WF_6$ chemistry includes an $H_2$ reduction and an $SiH_4$ reduction.

13. The method of claim 10, wherein the TiN layer is formed by depositing TiN to a thickness in a range of about 30 to 300 μm with a reactive sputtering or a CVD method.

14. The method of claim 10, wherein the first conduction line comprises a gate or a buried bit line of a transistor.

15. The method of claim 10, wherein the second conduction line comprises a source or drain region or a wiring strapping element.

16. The method of claim 15, wherein the source or drain region comprises an impurity doped region of single crystal silicon or a region formed of metal self-aligned silicide serving as a barrier.

17. The method of claim 10, wherein at the time of tungsten deposition, a barrier metal has been formed on the surface of the second conduction line, wherein the contact hole over the second conduction line is buried up to about the height of the first conduction line with a $WF_6$ chemistry that utilizes $H_2$ reduction, wherein the contact hole over the second conduction line and the contact hole over the first conduction line are simultaneously buried with a $WF_6$ chemistry that utilizes $SiH_4$ reduction.

18. The method of claim 10, wherein the second conduction line comprises silicon, wherein the contact hole over the second conduction line is deeper than the contact hole over the first conduction line, wherein the contact holes are simultaneously buried with a $WF_6$ chemistry that utilizes $SiH_4$ reduction.

* * * * *